(12) United States Patent
Salmaso (10) Patent No.: US 8,878,313 B2
(45) Date of Patent: Nov. 4, 2014

(54) PRESSURE SENSOR (75) Inventor: Luca Salmaso, Mendrisio (CH)

(73) Assignee: Metallux SA, Mendrisio (CH)

(*) Notice: Subject to any disclaimer, the term of this patent is extended or adjusted under 35 U.S.C. 154(b) by 306 days.

(21) Appl. No.: 13/321,373

(22) PCT Filed: May 20, 2010

(86) PCT No.: PCT/IB2010/052247
§ 371 (c)(1),
(2), (4) Date: Jan. 16, 2012

(87) PCT Pub. No.: WO2010/134043
PCT Pub. Date: Nov. 25, 2010

(65) Prior Publication Data
US 2012/0104518 A1 May 3, 2012

(30) Foreign Application Priority Data
May 20, 2009 (IT) .............................. TO2009A0384

(51) Int. Cl.
*H01L 29/84* (2006.01)
*G01L 9/00* (2006.01)

(52) U.S. Cl.
CPC ..... *G01L 9/0042* (2013.01); *H01L 2224/49171* (2013.01)
USPC ........... 257/415; 257/416; 257/417; 257/426; 257/E29.324; 257/E21.002; 438/51; 73/1.71; 73/114.18; 73/182; 73/861.42; 73/708; 266/89; 702/33; 702/47; 702/138

(58) Field of Classification Search
None
See application file for complete search history.

(56) References Cited

U.S. PATENT DOCUMENTS

| 4,815,472 | A | | 3/1989 | Wise et al. |
| 5,207,103 | A | * | 5/1993 | Wise et al. .................. 73/724 |
| 5,563,380 | A | * | 10/1996 | Rostoker et al. ............ 174/260 |
| 5,571,970 | A | * | 11/1996 | Mutoh et al. .................. 73/724 |
| 2006/0273417 | A1 | * | 12/2006 | Ganapathi et al. ........... 257/415 |
| 2008/0054383 | A1 | | 3/2008 | Eriksen et al. |
| 2009/0314096 | A1 | * | 12/2009 | Colombo .................... 73/754 |

OTHER PUBLICATIONS

International Search Report and Written Opinion for corresponding PCT International Application No. PCT/IB2010/052247, dated Sep. 23, 2010.

* cited by examiner

*Primary Examiner* — Yasser A Abdelaziez
(74) *Attorney, Agent, or Firm* — Heslin Rothenberg Farley & Mesiti PC; Victor A. Cardona, Esq.

(57) ABSTRACT

A pressure sensor has a sensor body at least partly formed with an electrically insulating material, particularly a ceramic material, defining a cavity facing on which is a diaphragm provided with an electric detector element, configured for detecting a bending of the diaphragm. The sensor body supports a circuit arrangement, including, a plurality of circuit components, among which is an integrated circuit, for treating a signal generated by the detection element. The circuit arrangement includes tracks made of electrically conductive material directly deposited on a surface of the sensor body made of electrically insulating material. The integrated circuit is made up of a die made of semiconductor material directly bonded onto the surface of the sensor body and the die is connected to respective tracks by means of wire bonding, i.e. by means of thin connecting wires made of electrically conductive material.

17 Claims, 6 Drawing Sheets

PRESSURE SENSOR

CROSS REFERENCE TO RELATED APPLICATIONS

This application is a national stage of PCT International Application No. PCT/IB2010/052247, filed on May 20, 2010, and published in English on Nov. 25, 2010, as WO 2010/134043 A1, which claims priority to Italian Patent Application No. TO2009A000384 filed on May 20, 2010, the entire disclosures of which are incorporated herein by reference.

The present invention refers to a pressure sensor having the characteristics indicated at the preamble of claim 1.

Sensors of the mentioned type are used in devices for detecting the pressure of fluids (liquid and aeriform substances) various fields, such as in the automotive industry, household and household appliances industry, air conditioning and in the hydro-sanitary heating industry in general. These detection devices typically comprise a housing, defining a chamber having an inlet for a fluid to be subjected to pressure measurement, a pressure sensor accommodated in the chamber in such a manner that a diaphragm portion thereof is exposed to the fluid. On the diaphragm, which is at least partly formed with an electrically insulating material (for example a ceramic material or a metallic material at least partially coated by a insulating layer), there is arranged or extends at least partly a detector element, adapted to detect a bending or deformation of the same diaphragm; the device also usually comprises a printed circuit board at least partly accommodated in the chamber of the housing, at an insulated position with respect to the inlet of the fluid.

In some solutions, the body of the sensor, generally made of electrically insulating material in one or more parts, itself supports a circuit arrangement, configured to treat a signal indicating a bending of the diaphragm, and thus of the pressure of the fluid. In most of the known solutions, this circuit arrangement comprises a printed circuit board, usually made of fibre glass, made on which is an electric circuit pattern, made up of a plurality of tracks made of electrically conductive material. Mounted on the board are various circuit components, such as capacitors, resistors, integrated circuits, connected to the abovementioned tracks. The board, with the respective components, is mounted onto the body of the sensor, in such a manner to be in signal communication with the detection element arranged on the diaphragm, for example made up of a resistive bridge.

The present invention substantially aims at providing a pressure sensor with improved structure and/or functionalities with respect to the prior art, in particular regarding the reduction of the overall dimensions and the manufacturing costs of the abovementioned circuit arrangement, the production reliability of the sensor and the operating reliability and accuracy thereof.

These and other aims, which shall be clear hereinafter, are attained according to the invention by a pressure sensor, by a method for manufacturing a pressure sensor and by a device incorporating a pressure sensor having the characteristics indicated in the attached claims, which form an integral part of the technical disclosure provided in relation to the invention.

Further aims, characteristics and advantages of the present invention shall be clear from the detailed description that follows and from the attached drawings, strictly provided for exemplifying and non-limiting purposes, wherein.

Hereinafter in the present description, terms such as "upper" and "lower" shall be intended as simple spatial reference to facilitate the description of the details illustrated in the figures.

Figure 1:
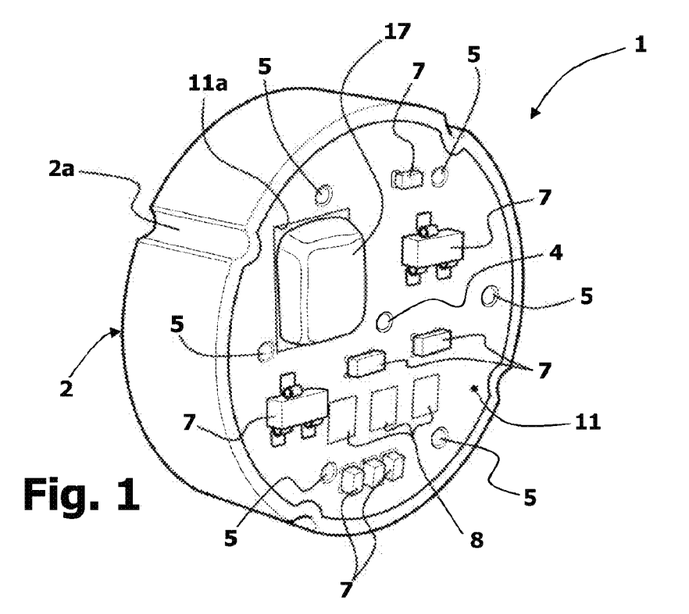
FIG. 1 is a schematic perspective view of a pressure sensor according to the invention.
Figure 2:
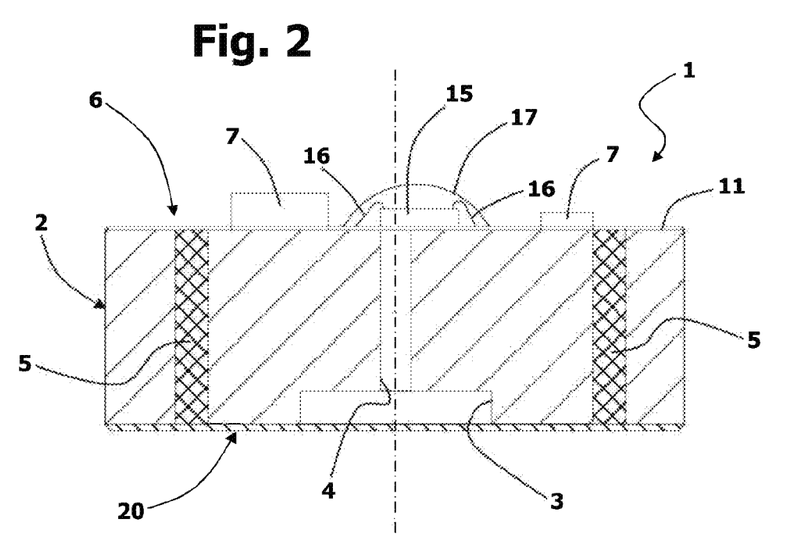
FIG. 2 is a schematic section of a pressure sensor according to the invention.

Indicated in its entirety with 1 in FIGS. 1 and 2, is a pressure sensor according to the present invention. In the exemplified embodiment, the sensor 1 has a main body 2, preferably made of electrically insulating material, such as a ceramic material or the like, for example alumina, such body 2 being preferably—but not necessarily—monolithic and having a generally cylindrical shape, with some perimeter reference or positioning seats, one of which indicated with 2a. Defined in the body 2 is a blind cavity or pressure chamber, indicated with 3 in FIG. 2, departing from whose bottom is a through hole 4, or pressure passage, such chamber and passage being preferably, but not necessarily, substantially coaxial to the axis of the body 2. The passage 4 passes through the body 2 completely, opening at the end or face of the body itself opposite to that on which the chamber 3 opens.

Defined in the body 2 are further through holes, some of which are indicated with 5, passing through the body at a peripheral position with respect to the chamber 3 and the passage 4. Preferably, at least the internal cylindrical surface of these holes 5 is covered by a thin layer made of electrically conductive material, particularly a metal; hereinafter, the holes 5 shall be defined metallised holes for the sake of simplicity.

The body 2 supports, on the upper surface thereof, a circuit arrangement or circuit, indicated in its entirety with 6, comprising a plurality of circuit components, conceived in a manner generally known in the art, and at least one integrated circuit. The circuit 6 is configured for obtaining the functionalities typically associated to the pressure sensors of the known type, for example prearranged for treating (detection, amplification, conditioning, processing) a signal representing the pressure, measured as described hereinafter. Some of the abovementioned circuit components, which are assumed to be resistors, capacitors and diodes, are indicated with 7, while indicated with 8—solely in FIG. 1—are terminals or pad contacts for the external electrical connection of the sensor 1.

According to a characteristic of the invention, made directly on the upper surface of the body 2 is an electric circuit pattern, comprising a plurality of tracks made of electrically conductive material, not shown in FIG. 1, screen printed or however deposited directly on said upper surface of the body 2; also directly formed on the surface of the body 2 may be circuit components, such as for example screen printed resistors. Thus, according to such characteristic, the ceramic material forming the body 2 is exploited directly as a substrate for the circuit 6 of the sensor 1, without requiring a special fibreglass printed circuit board, as it typically occurs in sensors according to the traditional art, and thus without even requiring to anchor such board to the body 2.

The abovementioned tracks are arranged in such a manner to leave, on the upper surface of the body 2, an area intended for mounting an integrated circuit or chip, described hereinafter free. Some of the abovementioned conductive tracks and resistors formed on the upper surface of the body 2 are observable in FIG. 4 (wherein a protection layer, described hereinafter was not represented), respectively indicated with 9 and 10. The components 7 are connected, for example by means of welding, to the tracks 9, while the abovementioned chip is connected to respective tracks 9 or components 7 through another technique, described hereinafter. The terminal 8 may be obtained directly from the respective track portions 9 or, if configured as additional parts, they are connected to such tracks, for example by means of welding.

According to a preferred characteristic, the tracks 9 and the possible screen printed resistors 10 are covered by a protection layer made of polymeric material, resistant to humidity, indicated with 11. The layer 11 is open locally, or it has windows, at least at the connection points of some circuit components 7 at the conductive tracks 9. The layer 11 also has a local opening or window, indicated with H a solely in FIG. 1, at the mounting zone of the abovementioned chip.

According to another characteristic of the invention, the abovementioned chip belonging to the circuit 6 is made up of a so-called "die", i.e. a small block or plate made of semiconductor material, typically silicon, which is bonded (die-bonded) directly onto the upper surface of the ceramic body 2, particularly glue-bonded. Directly obtained in the abovementioned die, generally indicated with 15 in FIGS. 2-4, is the miniaturized electronic circuit of the integrated circuit which supervises the general operation of the pressure sensor.

Figure 3:
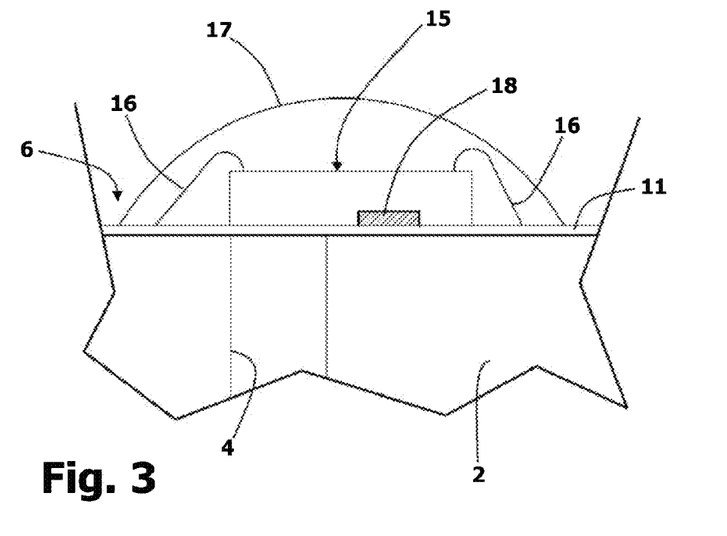
FIG. 3 is an enlarged detail of the sensor of FIG. 2.
Figure 4:
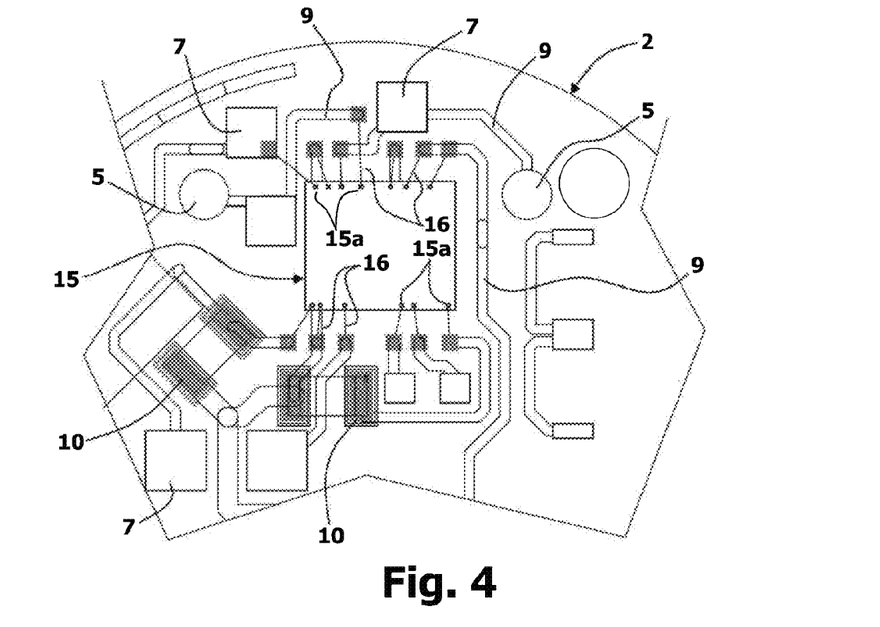
FIG. 4 is a plan view, partial and schematic, of a pressure sensor according to the invention, with some elements removed for more clarity of representation.

In the example illustrated in FIGS. 2-4, the die 15 is configured as a single plate or block made of silicon having a quadrangular section, but such solution shall not be intended as restrictive, given that the die 15 may have shapes different from those illustrated and be made of a plurality of mutually joined parts or layers made of silicon. The die 15 is obtainable through techniques per se known in the industry for producing semiconductor chips.

Preferably, the die 15 is without a package, and thus without respective projecting connection leads, typically obtained from relatively stiff metal elements, and directly positioned on the upper face thereof are contacts, some indicated with 15a in FIG. 4, in form of thin films made of electrically conductive material deposited on the die, preferably but not necessarily a noble material, such as for example gold or a 1% silicon aluminium alloy; preferred materials or alloys useable for the purpose may comprise gold, platinum, silicon, palladium, beryllium, silver, aluminium and copper.

According to a further characteristic of the invention, the connection of the die 15 to the conductive tracks 9 and/or to the components 7 of interest is obtained by means of added flexible contact elements, made up of thin wires made of electrically conductive material. The wires, some of which are indicated with 16 in FIG. 4, are preferably but not necessarily made using noble metal, such as for example gold or a 1%, silicon aluminium alloy and have a diameter indicatively comprised between about 5 and 100 microns, preferably between about 25 and about 35 microns. Preferable materials or alloys useable for making the micro-wires 16 comprise gold, platinum, silicon, palladium, beryllium, silver, aluminium and copper. The micro-wires 16 are bonded or however connected between the contacts 15a of the die 15 and the tracks 9 and/or the components 7 of interest of the circuit 6, using processes of the known type such as "wire bonding", and particularly of the "wedge-bonding" or "ball-bonding" type, for example by means of thermocompression, or ultrasonic bonding, or thermosonic bonding; the micro-wires 16 may have different shapes or sections, such as a circular or quadrangular or substantially flat shape or section, for example flexible micro-ribbons made of conductive material.

Such characteristic, alongside allowing directly exploiting the ceramic material of the body 2 as substrate even for the die 15, allows avoiding bonding on the tracks 9 of the leads projecting from an integrated circuit, as it typically occurs according to the known surface mount technique, such projecting leads having a section and stiffness comparatively greater with respect to the micro-wires 16. In other words, the process of wire bonding used according to the invention determines welding points of minimum dimensions on the circuit 6, performed on highly flexible connection elements (the wires 16): this allows an easier and more accurate positioning of the die, which may for example be definitely positioned at contact with said substrate, also allowing reducing the overall dimensions of the circuit 6.

As mentioned, the die 15 is not provided with its own package: for such reason, in the preferred embodiment of the invention, applied on the die 15 and the respective connection micro-wires 16, as well as on the bonding region of such micro-wires 16 with the tracks 9 and/or components 7 of interest, is a mass of a protective insulating material, such as a resin, particularly an epoxy resin, indicated with 17 in FIGS. 1-3 (also the protection 17 was not represented in FIG. 4), for example poured or dosed in liquid form and then left to harden. The mass 17, alongside protecting the die 15, allows bonding it further to the body 2, securing the position thereof. In a possible embodiment, the die 15 is directly bonded to the body 2 by means of resin-bonding alone, or by means of the protective mass 17 alone.

In an advantageous embodiment of the invention, the pressure sensor 1 according to the invention is provided with temperature detector means, configured to detect the temperature of the sensor itself and/or of the substrate on which it is mounted, such parameter being particularly used by the control logic implemented in the die 15 to compensate the pressure detections carried out; temperature detection is also useable by the control logic for protecting the sensor 1.

In a particularly advantageous embodiment of the invention, the abovementioned detector means include at least one temperature sensor incorporated or obtained directly in the die 15. Such embodiment is exemplified in FIG. 3, wherein the abovementioned temperature sensor is schematically represented by the block indicated with 18. In such manner, given that the die 15 is practically mounted at direct contact with the surface of the body 2, which provides the ceramic support of the circuit 7, the temperature sensor 18 is capable of accurately detecting the temperature of the body of the sensor 1. It should be observed that the typical integrated circuits with package and/or projecting connection leads, typically used in known pressure sensors, even when mounted through Surface Mount Device or SMD technique, still remain slightly raised or spaced by the respective circuit support and/or a portion of the material of the package remains interposed between the element made of semiconductor material and the body on which the SMD component is mounted, with ensuing slight detection errors: thus, the abovementioned preferred characteristic of the invention guarantees temperature detection with improved accuracy.

In possible variants, the sensor 1 may be provided with several temperature detector means, intended to detect the environment temperature and/or indirectly the temperature of the fluid to be measured, for example with respective temperature sensors also mounted at different positions in the die and/or in the circuit, such as a sensor towards the environment (upwards) and a sensor towards the substrate (downwards).

With particular reference to FIG. 2, in the exemplified preferred embodiment of the invention, associated to the lower end of the body 2 is a diaphragm body, indicated with 20, hereinafter defined as "diaphragm" for the sake of simplicity, preferably made of electrically insulating material, for example the same ceramic material used to make the body 2. The diaphragm 20 is provided with an electric detector element, capable of generating a signal representing a bending of the diaphragm itself; detection elements useable for the purpose may for example be selected from among resistor elements, capacitive elements and piezoresititive elements.

Obtained on the body of the diaphragm 20, and specifically on the surface thereof facing the body 2, are electrically conductive tracks, for forming and/or connecting the abovementioned detection element which, strictly for exemplifying purposes, is assumed to be made up of a bridge of resistors. For example, referring to FIG. 8, the resistors, indicated with 21, are positioned or extend at least partly in a substantially central region of the diaphragm 20, or in a region subjected to elastic deformation, which in the mounted condition of the latter at least partly faces the interior of the chamber 3. The resistors 21 are connected between the first ends of the abovementioned conductive tracks, indicated with 22, whose second ends are instead in a peripheral region of the diaphragm 20, preferably in a region subjected to elastic deformation; the abovementioned second ends of the tracks 22 serve for electric connection of the detection means represented by the bridge of resistors 21 to the circuit 6, by means of the metallised holes 5, as observable hereinafter. In the example, the ends 22a of the tracks 22 are substantially configured to form a pad, measuring a few hundreds of microns in size, indicatively comprised between about 200×200 and about 400×400 microns.

According to a preferred characteristic of the invention, the diaphragm 20 is glue-bonded to the main body 2, in such a manner to obtain airtight closure of the chamber 3 on the lower side of the body 2. Glue-bonding is carried out in such a manner that the conductive tracks 22, and more precisely the connection end 22a thereof, are positioned at the lower ands of the metallised holes 5, and in such a manner to allow, due to the subsequent deposition of a conductive material, such as glue, electric connection with the conductive material that covers the surfaces of the holes themselves. Obviously, in the design step, the geometry of the tracks 22 and the position of the respective ends 22a is selected for the purpose.

As observable, the upper ends of the metallised holes 5 are in turn electrically connected to some of the conductive tracks 9 belonging to the circuit 6, which are located on the upper surface of the body 2, in such a manner that the detector part incorporated on the diaphragm 20 is electrically connected or in signal communication with the circuit 6.

In the embodiment of the invention illustrated in the figures, the sensor 1 is provided for the detection of a relative pressure, i.e. it is configured for measuring the pressure applied to the diaphragm 20 with respect to the environment pressure; for such purpose, the passage 4 is open at the upper face of the body 2. The same sensor structure illustrated in the figures is however useable for obtaining absolute pressure sensors, by simply closing the passage 4 at the upper end, for example by means of a tin drop. In this second case, present in the internal chamber 3 and in the passage 4 may be two conditions: vacuum, created in a per se known manner in the production step, or a predefined pressure, such as the environment pressure existing during production, i.e. when occluding the passage 4, which defines the sensor as a "seal gauge sensor".

The general operation of the pressure sensor 1 occurs according to known methods, and thus it shall not be described herein in detail. Generally, in practical use, the sensor 1 may be mounted in a device for detecting the pressure of fluids (liquid and aeriform substances), such as in the automotive industry, household and household appliances industry, air conditioning and in the hydro-sanitary heating industry in general. Such device has a housing defining an inlet which receives a fluid to be subjected to pressure detection, the sensor 1 being mounted in the housing such that the diaphragm 20 shall be exposed to the fluid. The mechanical deformation of the diaphragm 20, due to the pressure of the fluid subjected to measurement, modifies the resistance value in output from the bridge of resistors 21. The circuit 6 detects the output signal from the bridge of resistors, by means of metallised holes 5, and process it according to per se known methods (possible amplification and/or conditioning and/or processing), then making it available to the outside by means of the terminals 8 of FIG. 1, possibly connected to a suitable electric connector associated to the abovementioned housing.

As mentioned, the circuit 6 is configured to obtain the functionalities typically associated to pressure sensors of the known type. As outlined previously, according to a preferred characteristic of the invention, the sensor 1 is further provided with temperature detector means, preferably incorporated in the die 15, which allow compensating the performed temperature detections.

According to possible variants, the sensor may be provided with further temperature sensor means, for example mounted in proximity to the diaphragm and/or the resistive sensor bridge, connected to the circuit 6 and/or to the die 15.

The die 15 provides a digital processor, such as a microprocessor or microcontroller circuit, which can be provided with—or have associated thereto—electronic memory means, preferably of the non-volatile and/or electronically rewritable type, such as for example of the EEPROM or Flash type, such memory means MEM being suitable to store information permanently even in the absence of power supply.

The control part 6, 15 of the sensor 1 is configured to detect and condition the signal of the resistive bridge, generating a ratiometric signal amplified at the output, preferably variable between 0.5 V and 4.5 V, by means of the three terminals 8. The control part 6, 15 is also configured for controlling and conditioning the signal of possible temperature detector means, such as the sensor 18. The circuit parts that implement the conditioning of the signals of the resistive bridge and/or of the temperature detector means may for example comprise an amplifier stage or a voltage divider. The amplifier stage may preferably be calibrated or adjusted by varying at least one external parameter, such as a resistive value. Such variation of the external parameter may be obtained by means of a calibration circuit part, which may comprise, for the purpose, a digital potentiometer. The die 15 is also preferably configured for periodically detecting the degree of accuracy of the sensor, such as the accuracy of the bridge and temperature sensor means, by performing—when required—an automatic calibration of the respective conditioning circuit part. Also for such purpose, the circuit 6 may be additionally provided with functionalities for compensating possible drifts or "offsets", for example for each sensor provided for, controlled by the die 15.

Furthermore, preferably, the control part 6, 15 is also configured to obtain:
- an incorporated ESD protection (protection/shielding against electromagnetic interferences);
- protection against overvoltage and/or protection against polarity inversion;
- calibration and self-calibration functions, for example such as calibration or programming during the production step or self-calibration during periodic testing and automatic calibration, or aging detection, i.e. correction of pressure detections due to elapsed time;
- functions regarding programming or memorising or reading parameters or data or program instructions, such as a transmission or writing and/or data reception or reading or parameters or instructions, preferably after the assembly of the control part 6, 15, in particular by means of the terminals 8, which also serve as an output for the measurement signals generated by the pressure sensor 1.

Furthermore, still preferably, the control part 6, 15 implements diagnostic or self-diagnostic functions, status or malfunction signal generation functions, autonomously or even following a query.

Following is a preferred method for making the sensor 1.

Figure 5:
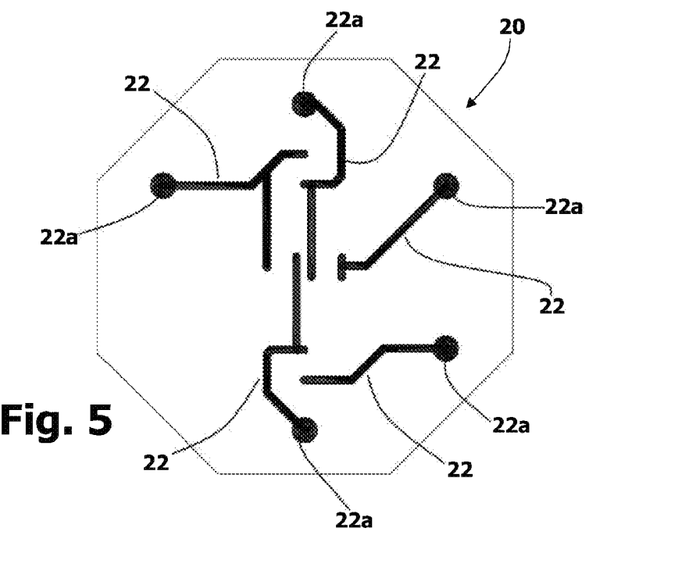
FIGS. 5-8 are plan schematic views of a component of a pressure sensor according to the invention, in various steps of the respective production process.

Conductive tracks 22 are formed on the ceramic body of the diaphragm 20 by means of deposition—preferably through silk-screen printing technique—of a conductive material, such as for example a silver-palladium alloy; the result of such step is schematically represented in FIG. 5. After depositing the material there follows drying and baking of the semi-finished product of FIG. 5, with suitable temperatures and times depending on the material used.

Figure 6:
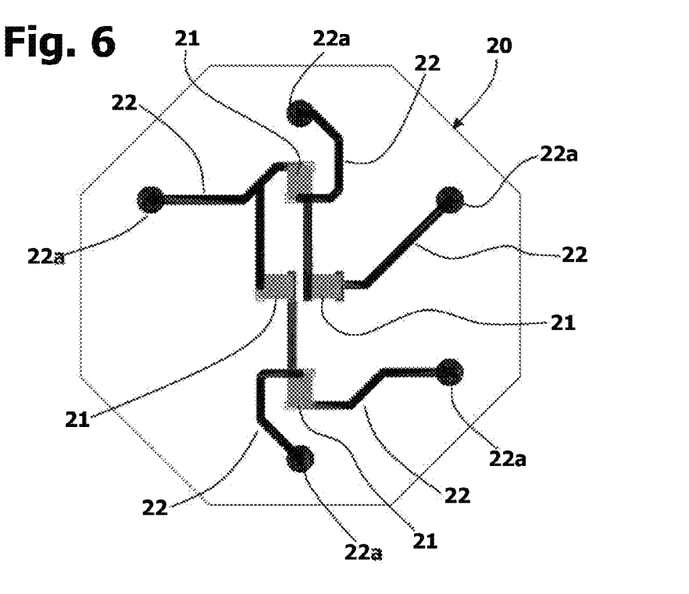

Then, the material intended to form the resistors 21, for example a resistive paste 10k preferably silk-screen printed, is deposited on the diaphragm 20, as schematized in FIG. 6, in such a manner to obtain the detection element, or the resistive bridge. Also in this case, after depositing the material, there follows the drying and baking of the semi-finished product of FIG. 6, with suitable temperatures and times.

Figure 7:
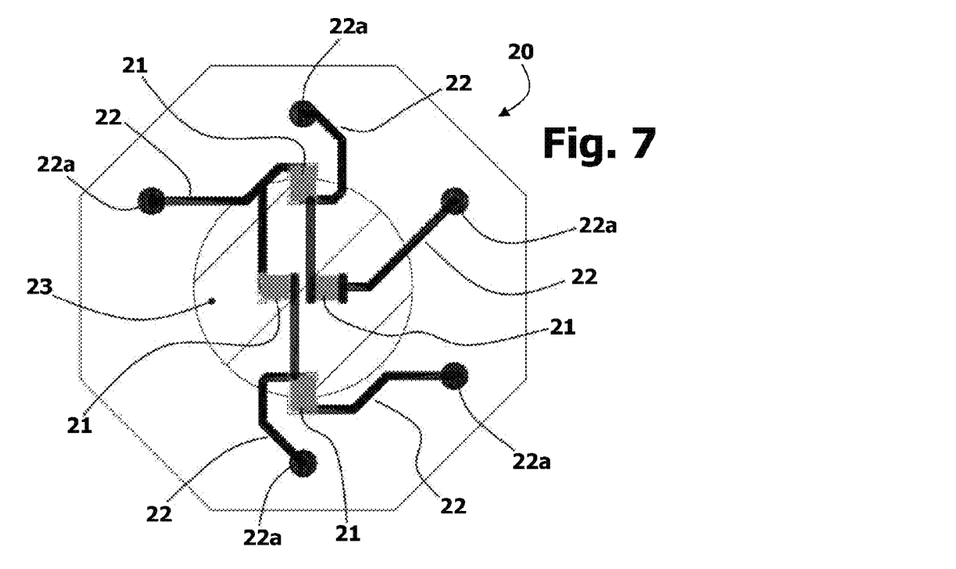

Then, a layer of protective material, particularly glass, is deposited on the diaphragm 20, preferably by means of silk-screen printing, in such a manner to cover the detection element, or the resistive bridge; such protective layer made of glass is indicated with 23 in FIG. 7. Also in this case, after depositing the material, there follows the drying and baking of the semi-finished product of FIG. 7, with suitable temperatures and time.

Figure 8:
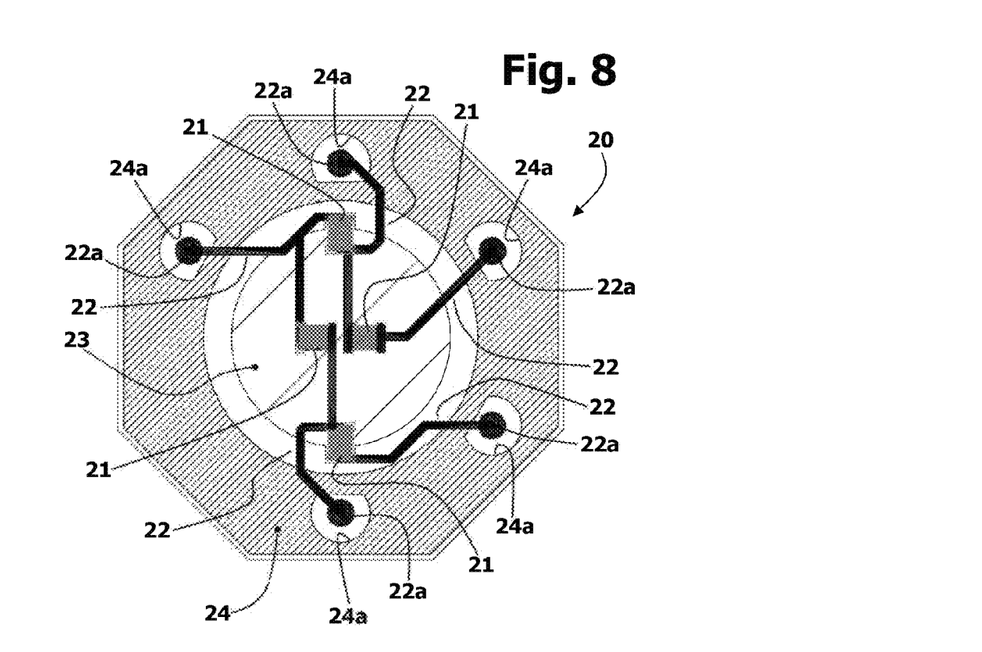

Then, a layer of adhesive material or glue, indicated with 24 in FIG. 8, is deposited on the diaphragm 20, also in this case preferably by means of silk-screen printing. The useable adhesive may also for example be a low or medium melting temperature glass paste or a thermosetting resin. As observable, the adhesive layer 24 is configured in such a manner not to cover neither the central zone of the diaphragm 20, present in which is the detection part covered by the glass layer 23, nor some local zones 24a surrounding the connection ends 22a of the tracks 22. Also in this case, after depositing the adhesive layer, there follows the drying and baking of the semi-finished product of FIG. 8.

Regarding the obtainment of the circuit part 6 provided for on the main body 2, the first step of the process is preferably the metallisation of the holes 5; as mentioned, for such purpose a layer made of metal or another electrically conductive material is deposited, through per se known methods, on the surface of the holes 5. This deposition is preferably carried out in such a manner that part of the metal or conductive material projects outside the holes 5 at the corresponding ends, for example partly on the lower and upper surfaces of the body 2. After depositing the material there follows the drying and baking of the semi-finished product, with suitable temperatures and time.

Then, the conductive tracks 9 are formed on the upper face of the body 2, by means of deposition—preferably through silk-screen printing technique—of a conductive material, such as for example a silver-palladium alloy; then, there follows the respective steps of drying and baking. The tracks 9 may possibly be deposited in such a manner to be electrically at contact with the conductive material of the holes 5, or with the part of such material projecting outside the holes themselves; alternatively, the ends of the tracks 9 may be put to contact with the metallised holes 5 by depositing an additional conductive material, as explained hereinafter.

A thin layer of the same material forming the micro-wires 16, or compatible with the material forming the micro-wires, is deposited on the ends of the tracks 9 which shall be connected to the die 15 by means of micro-wires 16 (FIGS. 3 and 4), preferably by means of silk-screen printing. Also in this case, the deposition of the material is followed by respective drying and baking steps.

Then, there follows the deposition, still on the upper surface of the body 2, of a material intended to obtain the possible resistors 10 of FIG. 4. The material in question may be for example a resistive paste, deposited by means of silk-screen printing; obviously, such material is deposited in such a manner that the obtained resistors 10 are electrically at contact with respective conductive tracks 9. Also in this case, after depositing the material there follows the drying and baking of the semi-finished product, with suitable temperatures and time.

Then, a layer of an adhesive or glue is deposited on the face of the body 2 opposite to the circuit 6, by means of silk-screen printing, with subsequent drying and baking steps. The adhesive is preferably of the same type as that used for making the layer 24 provided for on the diaphragm 20 (FIG. 8). As evincible, the deposition of the adhesive material is limited to the peripheral zone of the abovementioned lower face of the body 2, i.e. the region of such face delimiting the opening of the cavity 3 of FIG. 2.

Then, the two body parts 2 and 20 of the sensor 1 are bonded to each other. For such purpose, the adhesive layer 24 of the diaphragm 20 is placed on the adhesive layer present on the lower face of the body 2. As mentioned previously, the relative positioning is such that the connection ends 22a of the tracks 22 of the diaphragm (see FIG. 8) are overlapped and at contact with the conductive material of the holes 5, on the lower surface of the body 2. Certainty of electric contact is preferably ensured by dosing a conductive paste or epoxy glue into the holes 5, which fills the interspace between the hole itself and the respective connection end or pad 22a, hence guaranteeing contact.

Then, there follows a baking step, required to obtain adhesion between the two abovementioned adhesive layers, and thus the perfect sealed adhesion between the parts, and possibly an at least partial melting of the electrically conductive material to obtain or improve electric connections; this baking step is preferably followed by a hermeticity test, performed in per se known manners.

If required, the upper ends of the metallised holes 5 may be put to electric contact with the respective tracks 9, by means of local deposition of a conductive paste or glue, in the respective interface zones; also this step, when provided for, is followed by a drying and baking operation. Alternatively, provided for may be the sole reflow of at least part of the previously deposited electrically conductive materials, in particular in the zone between the body and diaphragm.

The detection element provided for on the diaphragm 20, i.e. the resistive bridge, is thus balanced or calibrated, through per se known methods.

Then, there follows the deposition, preferably by means of silk-screen printing, of the polymeric material intended to provide the protective layer 11 of FIGS. 1-3, followed by the relative drying and baking. As outlined previously, the layer 11 is deposited in such a manner to leave the zones in which the components 7 of the circuit 6 shall be connected to the conductive tracks 9 exposed. Furthermore, the layer 11 is deposited in such a manner to leave, by means of the window 11a, also the region of the upper surface of the body 2 in which the die 15 is to be glued, directly exposed; obviously also exposed in such region are the ends of the tracks 9 to which the micro-wires 16 are to be connected.

At this point, the components 7 of the circuit 6 are mounted on the upper part of the body 2, preferably by means of the SMD technique. As evincible, in such step, the leads for connecting the components 7 in question are connected electrically with the respective tracks 9. Then, there follows a reflow welding.

After such step, the die 15 is bonded, particularly by means of gluing, onto the upper surface of the body 2, at the dedicated zone not occupied by the tracks 9 or other components of the circuit 6, and left exposed by the protective layer 11. The step comprises the deposition of a suitable conductive adhesive or glue, on at least one of the lower face of the die 15 and the corresponding positioning zone on the surface of the body 2. Preferably, this conductive adhesive has good thermal conduction characteristics, in particular with the aim of facilitating the measurement of temperature by the temperature sensor 18 inside the die 15 and/or guarantee good thermal dissipation.

After gluing the die 15 there follows the step of electric connection or wire bonding, i.e. the connection of the micro-wires 16, between the respective contacts 15a of the die 15 and the ends of the conductive tracks 9 in question, according to a per se known technique.

At this point, the insulating protection 17 of FIGS. 1-3—as mentioned for example made up of a mass of resin, preferably an epoxy resin—is deposited on the die 15 and the respective connection micro-wires 16, as well as on the bonding region of such micro-wires 16 with the tracks 9 and/or components 7 of interest. Then, there follows a step of polymerising such material.

Should the sensor 2 be of the absolute type, the upper end of the passage 4 must be closed hermetically: thus, in such case, a drop of suitable material, for example tin, is deposited—under a vacuum environment—preferably by means of silk-screen printing or welding, to close the abovementioned end.

Then, there follows the welding of the connection terminals or wires 8 of FIG. 1 to the tracks 9 of interest of the circuit 6, required for the connection of the sensor 1 for use thereof. Then, the sensor, and in particular the die 15, is calibrated electronically. For such purpose, it should be observed that the detection element or the resistive bridge or the respective control circuit, is preferably of the digital calibration type.

It is clear that the sensor described for exemplification purposes may be subjected—by a man skilled in the art—to numerous variants, without departing from the scope of the invention as defined in the attached claims.

The invention was described with reference to a pressure sensor in which the diaphragm 20 is configured as an additional part, in particular glue-bonded, to a further base, i.e. the main body 2. The base concepts of the invention are however applicable even in the case of pressure sensors having a base 2 without a hole 4, exclusively with the "seal gauge" configuration or having a monolithic body, integrally defining the respective diaphragm.

Figure 9:
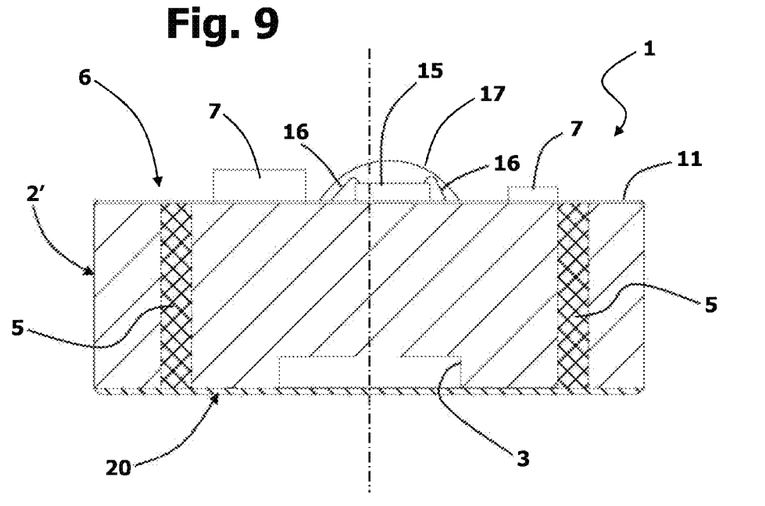
FIG. 9 is a schematic section, similar to that of FIG. 2, illustrating a pressure sensor according to a possible variant of the invention.

An example of the abovementioned first type sensor is illustrated in FIG. 9, where the abovementioned body or base without through hole is indicated in its entirety with 2'. Such sensor 1 may be used in case of medium and high pressures, offering greater safety due to a more solid structure.

Figure 10:
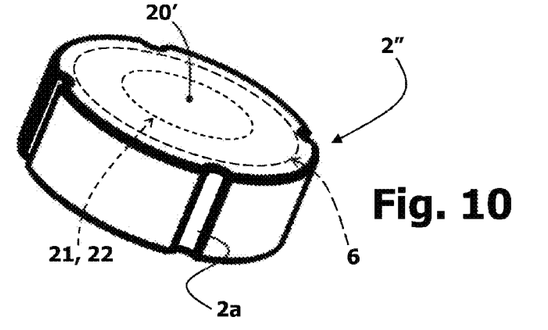
FIGS. 10 and 11 are schematic perspective views, in different angles, of a body made of electrically insulating material useable for making a pressure sensor according to a further possible variant of the invention.
Figure 11:
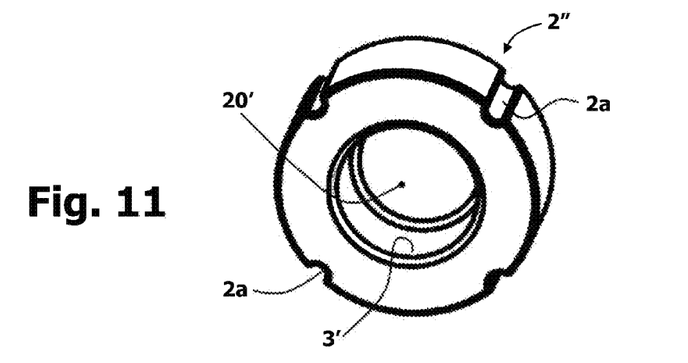
Figure 12:
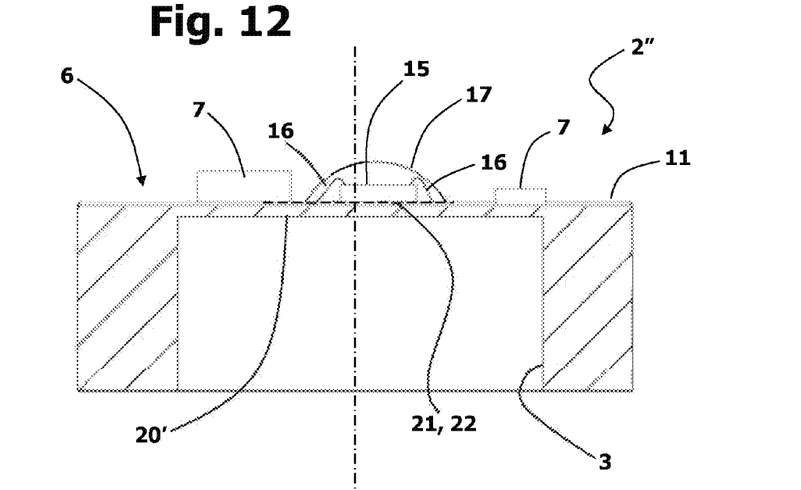
FIG. 12 is a schematic section, similar to that of FIG. 2, illustrating a pressure sensor according to a possible variant of the invention.

An example of a sensor with a monolithic body is instead illustrated schematically in FIGS. 10 and 11, where such body is indicated in its entirety with 2". In the illustrated example, the monolithic body 2", generally cylindrical-shaped, with some peripheral reference or positioning seats, is made at least partly of an electrically insulating material, such as a ceramic material, and has a blind cavity 3', substantially circular-shaped, closed at one end by a diaphragm portion 20' of the body itself. In such embodiment, provided for at the diaphragm portion 20', particularly in a central region of an upper surface thereof, is the detector component 21, 22, suitable to generate the signal representing a bending of the diaphragm portion itself, as well as a circuit having the characteristics of the one indicated previously with 6. Such circuit may be possibly formed entirely or partly in the peripheral zone of the upper surface of the body 2', i.e. in the annular region of the upper face of the body 2' surrounding the diaphragm portion 20'.

In a further possible variant, the temperature detector means of the sensor according to the invention may comprise a temperature sensor mounted on the diaphragm 20, facing into the chamber 3 and in signal communication with the circuit 6 including the die 15 by means of relative conductive tracks and metallised holes, conceptually similar to those previously indicated with 22 and 5.

The tracks 9 and/or possible resistors 10 may be obtained on the sensor body by means of a technique different from silk-screen printing, though it is the preferred technique; for example, alternative techniques for the tracks and/or resistors of the sensor may be selected from among lithography, photolithography, spraying conductive material, surface metallisation, plating, etcetera.

The invention claimed is:

1. A pressure sensor comprising:
   a sensor body having a monolithic body part and a diaphragm body part which are formed at least partly with electrically insulating material and have a cavity therebetween, the diaphragm body part at least partly facing said cavity and having thereon a detection element configured for detecting a bending or deformation of the diaphragm body part, the sensor body supporting a circuit arrangement which is in signal communication with the detection element, the circuit arrangement being prearranged for treating a signal generated by the detection element;
   wherein the monolithic body part has a first end face and a second end face opposite to each other and made of electrically insulating material, the first end face of the monolithic body part having a peripheral region and a central region which is recessed with respect to the peripheral region, such that said cavity is defined at said first end face to have a peripheral surface and a bottom surface formed of electrically insulating material of the monolithic body part;
   wherein the diaphragm body part has an inner side and an outer side, the inner side of the diaphragm body part being made of electrically insulating material and having a peripheral region bonded to the peripheral region of the first end face of the monolithic body part, such that a central region of the inner side of the diaphragm body part faces the recessed central region of the first end face of the monolithic body part, at a distance from the bottom surface of the cavity;

wherein first conductive tracks are provided at the inner side of the diaphragm body part, which extend from the peripheral region to the central region thereof, a plurality of first circuit components being connected to the first conductive tracks at the central region of the inner side of the diaphragm body part to form said detection element, the first conductive tracks each having a connection end at the peripheral region of the inner side of the diaphragm body part;

wherein the monolithic body part supports at the second end face thereof said circuit arrangement, which comprises a plurality of further circuit components, among which an integrated circuit consisting of a die made of a semiconductor material and free of package and projecting connection leads;

wherein the circuit arrangement includes an electric circuit pattern comprising a plurality of second conductive tracks made of electrically conductive material directly deposited onto said second end face of the monolithic body part, the circuit arrangement comprising second circuit components electrically connected to said second conductive tracks;

wherein said second conductive tracks are formed on said second end face of the monolithic body part such that a positioning region of said second end face is directly exposed, the semiconductor material at a lower surface of the die being bonded to said second end face at said positioning region, and the die being electrically connected to second conductive tracks or second circuit components by wire bonding including contact films made of electrically conductive material positioned on the semiconductor material at an upper surface of the die and micro-wires each extending between one said contact film and one said second conductive track or second circuit component;

wherein the monolithic body part has a number of through-holes extending between said second end face and the peripheral region of the first end face, said though-holes having a length which is greater that the distance between said second end face and the bottom surface of said cavity;

wherein an electrically conductive material is present in said through-holes, which electrically connects the connection ends of said first conductive tracks at the inner side of the diaphragm body part to respective second conduct tracks at the second end face of the monolithic body.

2. The sensor according to claim 1, wherein the micro-wires have a thickness or diameter between about 5 and 100 micron, particularly between about 25 to about 35 micron.

3. The pressure sensor according to claim 1, further comprising temperature detector means connected to, or comprised within, or integrated into said die.

4. The pressure sensor according to claim 1, wherein said die and said micro-wires, as well as at least part of a region of connection of said micro-wires with respective said second conductive track or second circuit component is coated with a mass of a protective insulating material.

5. The pressure sensor according to claim 1, wherein said second conductive tracks are coated with a protection layer, particularly a polymeric material, the protection layer being locally open at least at connection zones of at least some of said second circuit components to respective second conductive tracks, the protection layer further having a local opening at said positioning region.

6. The pressure sensor according to claim 1, wherein the circuit arrangement is spaced from the bottom surface of the cavity.

7. The pressure sensor according to claim 1, wherein the first circuit components are selected from resistive components and piezoresistive components.

8. The pressure sensor according to claim 1, wherein the second circuit components comprise second circuit components directly formed on said second end face of the monolithic body part.

9. The pressure sensor according to claim 8, wherein said second circuit components directly formed on said second end face of the monolithic body part comprise one or more resistors.

10. The pressure sensor according to claim 2, wherein the micro-wires are formed by a material or an alloy comprising, or based on a material selected from among gold, platinum, silicon, palladium, beryllium, silver, aluminum and copper.

11. A pressure sensor having a monolithic sensor body formed of electrically insulating material and having a first end face and a second end face opposite to each other, the sensor body integrally defining a tubular portion and a diaphragm portion at central region of said first end face, such that a blind cavity is defined in the sensor body, having a peripheral surface and a bottom surface formed of said electrically insulating material, wherein the diaphragm portion has a detection element configured for detecting a bending or deformation of the diaphragm portion and the sensor body supports a circuit arrangement which is in signal communication with the detection element and is prearranged for treating a signal generated by the detection element, wherein the diaphragm portion has an outer side belonging to said first end face of the sensor body and an inner side forming the bottom surface of said blind cavity, wherein conductive tracks are provided on the first end face of the sensor body, said conductive tracks comprising first conductive tracks which extend from a peripheral region of said first end face of the sensor body to the central region thereof, a plurality of first circuit components being electrically connected among said first conductive tracks at the central region of the outer side of the diaphragm portion to form said detection element, the first conductive tracks and the first circuit components being made of respective materials directly deposited onto said first end face of the sensor body, wherein said circuit arrangement is supported by the sensor body at said first end face, said circuit arrangement comprising a plurality of further circuit components, among which an integrated circuit consisting of a die made of a semiconductor material and free of package and projecting connection leads, the circuit arrangement also comprising second circuit components, wherein the circuit arrangement includes an electric circuit pattern comprising said first conductive tracks, the first conductive tracks and the second circuit components being arranged on said first end face of the monolithic sensor body such that a positioning region of said first end face is directly exposed, the semiconductor material at a lower surface of the die being bonded to said first end face at said positioning region and being electrically connected to first conductive tracks or second circuit components by wire bonding including contact films made of electrically conductive material positioned on the semiconductor material at an upper surface of the die and micro-wires each extending between a contact film of said contact films and a first conductive track of said first conductive tracks or second circuit component.

12. The pressure sensor according to claim 11, wherein the circuit arrangement is spaced from the bottom surface of the cavity.

13. The pressure sensor according to claim 11, wherein the first circuit components are selected from resistive components and piezoresistive components.

14. The pressure sensor according to claim 11, wherein the second circuit components comprise second circuit components directly formed on the first end face of the sensor body.

15. The pressure sensor according to claim 14, wherein the second circuit components directly formed on said first end face of the monolithic sensor body comprise one or more resistors.

16. The pressure sensor according to claim 2, wherein the micro-wires have a thickness or diameter between about 5 and 100 micron, particularly between about 25 to about 35 micron.

17. The pressure sensor according to claim 16, wherein the micro-wires are formed by a material or an alloy comprising, or based on a material selected from among gold, platinum, silicon, palladium, beryllium, silver, aluminum and copper.

* * * * *